(12) United States Patent
Kimura et al.

(10) Patent No.: US 8,053,970 B2
(45) Date of Patent: Nov. 8, 2011

(54) LIGHT EMITTING DEVICE AND ILLUMINATION DEVICE

(75) Inventors: Naoki Kimura, Sakura (JP); Ryuji Suzuki, Sakura (JP); Ken Sakuma, Sakura (JP); Naoto Hirosaki, Tsukuba (JP)

(73) Assignees: Fujikura Ltd., Tokyo (JP); National Institute for Materials Science, Ibaraki-ken (JP)

( * ) Notice: Subject to any disclaimer, the term of this patent is extended or adjusted under 35 U.S.C. 154(b) by 28 days.

(21) Appl. No.: 12/369,351

(22) Filed: Feb. 11, 2009

(65) Prior Publication Data
US 2009/0146549 A1 Jun. 11, 2009

Related U.S. Application Data

(63) Continuation of application No. PCT/JP2007/064861, filed on Jul. 30, 2007.

(30) Foreign Application Priority Data

Aug. 14, 2006 (JP) ................................. 2006-221062

(51) Int. Cl.
*H05B 33/14* (2006.01)
(52) U.S. Cl. ........................................................ 313/501
(58) Field of Classification Search .................. 313/501
See application file for complete search history.

(56) References Cited

U.S. PATENT DOCUMENTS

| 6,621,211 B1 * | 9/2003 | Srivastava et al. ............ 313/503 |
| 2005/0001532 A1 * | 1/2005 | Srivastava et al. ............ 313/484 |
| 2006/0001352 A1 * | 1/2006 | Maruta et al. .................. 313/486 |
| 2006/0045832 A1 * | 3/2006 | Nagatomi et al. ............. 423/325 |
| 2007/0108896 A1 | 5/2007 | Hirosaki |

FOREIGN PATENT DOCUMENTS

| EP | 1 278 250 A2 | 1/2003 |
| EP | 1 630 220 A2 | 3/2006 |
| JP | 10-163535 A | 6/1998 |

(Continued)

OTHER PUBLICATIONS

Hirosaki et al. "Characterization and properties of green emitting β-SiAlON: Eu2+ powder phosphors for white light-emitting diodes" Applied Physics Letters 86, 211905 (2005).*

(Continued)

*Primary Examiner* — Toan Ton
*Assistant Examiner* — Andrew Coughlin
(74) *Attorney, Agent, or Firm* — Sughrue Mion, PLLC

(57) ABSTRACT

An LED with a semiconductor light emitting element that emits a blue or a blue-violet light, and a fluorescent material that absorbs some or all of the light emitted from the element and emits a fluorescent light of a wavelength different from the absorbed light. The fluorescent material is a mixed fluorescent material obtained by mixing a first fluorescent material that emits a blue-green or a green light, a second fluorescent material that has a peak emission wavelength longer than that of the first fluorescent material and emits a green or a yellow-green light, a third fluorescent material that has a 1 peak emission wavelength longer than that of the second fluorescent material and emits a yellow-green, a yellow or a yellow-red light, and a fourth fluorescent material that has a peak emission wavelength longer than that of the third fluorescent material and emits a yellow-red or a red light.

23 Claims, 6 Drawing Sheets

FOREIGN PATENT DOCUMENTS

| | | |
|---|---|---|
| JP | 2900928 B2 | 3/1999 |
| JP | 2000-509912 A | 8/2000 |
| JP | 2002-363554 A | 12/2002 |
| JP | 2003-124527 A | 4/2003 |
| JP | 2003-273409 A | 9/2003 |
| JP | 2003-321675 A | 11/2003 |
| JP | 2927279 B2 | 11/2003 |
| JP | 2004-501512 A | 1/2004 |
| JP | 2005-285800 A | 10/2005 |
| JP | 2006-063233 A | 3/2006 |
| JP | 2006-080443 A | 3/2006 |
| JP | 2006-176546 A | 7/2006 |
| JP | 2007-180377 A | 7/2007 |
| WO | 01/89001 A2 | 11/2001 |
| WO | 2005/087896 A1 | 9/2005 |

OTHER PUBLICATIONS

Kanji Bando et al. "Development of High-bright and Pure-white LED Lamps", J. Light & Vis. Env., 1998, pp. 2-5, vol. 22 No. 1, The Illuminating Engineering Institute of Japan.

Ken Sakuma et al., "Warm-white light emitting diode with yellowish orange SiAlON ceramic phosphor", Optics Letters, Sep. 1, 2004, pp. 2001-2003, vol. 29 No. 17, Optical Society of America.

Motokazu Yamada et al., "Red-Enhanced White-Light-Emitting Diode Using a New Red Phosphor", Jpn. J. Apl. Phys., Jan. 15, 2003, pp. L20-L23, vol. 42, The Japan Society of Applied Physics.

Paul S. Martin, "Performance, Thermal, Cost & Reliability challenges for Solid State Lighting", OIDA Conference, May 30, 2002, pp. 1-29, Lumileds Lighting LLC Company Confidential.

R. J. Xie et al., "Eu2+-doped Ca-$\alpha$-SiAlON : A yellow phosphor foe white light-emitting diodes", App. Phys. Lett., 2004, pp. 2001-2003, vol. 29.

R. J. Xie et al., "Eu2+-doped Ca-$\alpha$-SiAlON : A yellow phosphor for white light-emitting diodes", App. Phys. Lett., 2004, pp. 5404-5406, vol. 84.

X. Rong-Jun et al., "Highly efficient white-light-emitting diodes fabricated with short-wavelength yellow oxynitride phosphors", Applied Physics Letters, AIP, American Institute of Physics, Melville, NY, US, vol. 88, No. 10, Mar. 6, 2006, pp. 101104-101104.

European Search Report issued in European Applicaiton No. 07805885.6 dated Apr. 27, 2011.

Y.Q. Li, et al., "Luminescence Properties of Eu2+-Activated Alkaline-Earth Silicon-Oxynitride MS1202-deltaN2+2/3delta (M = Ca, Sr, Ba): A Promi-sing Class of Novel LED Conversion Phosphors", Chemistry of Materials, vol. 17, May 20, 2005, pp. 3242-3248.

H. Naoto, et al., "Characterization and properties of green-emitting[beta]-SiA1ON:Eu2+powder phosphors for white light-emitting diodes", Applied Physics Letters, AIP, American Institute of Physics, Melville, NY, US, vol. 86, No. 21, May 17, 2005, pp. 211905-211905.

\* cited by examiner

LIGHT EMITTING DEVICE AND ILLUMINATION DEVICE

TECHNICAL FIELD

The present invention relates to a light emitting device such as a white light emitting diode lamp and a light emitting apparatus that uses the device, and relates particularly to a light emitting device designed for use within the field of illumination and an illumination device that uses the light emitting device.

Priority is claimed on Japanese Patent Application No. 2006-221062, filed Aug. 14, 2006, the content of which is incorporated herein by reference.

Currently, in the field of illumination, considerable expectation has been focused on white illumination that uses solid-state illumination and particularly semiconductor light emitting diodes, and wide-ranging research and development continues to be actively pursued. White light emitting diode lamps have already reached a light emission efficiency that is similar or superior to that of incandescent lamps, and are still undergoing further improvement. It is thought that within the near future, these white light emitting diode lamps will become widespread as energy efficient illumination devices. Furthermore, the fact that they contain no materials such as mercury that have an adverse environmental impact is also a significant advantage. Moreover, because the dimensions of these elements are small, they can be used in many applications, such as the backlights for liquid crystal display devices or within mobile telephones.

In the following description, the term "light emitting diode" is abbreviated as LED.

BACKGROUND ART

White LEDs that combine a LED element that emits light having a short wavelength such as a blue light or an ultraviolet light and a fluorescent material that is excited by absorbing some or all of the light emitted from the LED element and then emits a fluorescent light of a longer wavelength such as a yellow fluorescent light are already known. For example, white LEDs composed of a compound semiconductor blue LED element and a cerium-activated yttrium-aluminum-garnet fluorescent material that absorbs blue light and then emits a yellow fluorescent light that is a complementary color to blue are disclosed in Japanese Patent (Granted) Publication No. 2,900,928, Japanese Patent (Granted) Publication No. 2,927,279, and K. Bando, K. Sakano, Y. Noguchi and Y. Shimizu, "Development of High-bright and Pure-white LED Lamps," J. Light & Vis. Env. Vol. 22, No. 1 (1998), pp. 2 to 5.

Adding a red fluorescent material to compensate for the lack of a red component is also a known technique, and Japanese Unexamined Patent Application, First Publication No. 2003-321675 discloses a technique in which a red fluorescent material such as $(Sr_{1-x-y-z}Ba_xCa_y)_2Si_5N_8:Eu_z^{2+}$, SrS: Eu, CaS:Eu or $(Ca_xSr_{1-x})S:Eu^{2+}$ is added to a white LED composed of a blue LED element and a cerium-activated yttrium-aluminum-garnet fluorescent material. Similar techniques are also disclosed in Japanese Unexamined Patent Application, First Publication No. 2003-321675 and M. Yamada, T. Naitou, K. Izuno, H. Tamaki, Y. Murazaki, M. Kameshima and T. Mukai, "Red-Enhanced White-Light-Emitting Diode Using a New Red Phosphor" Jpn. J. Appl. Phys. Vol. 42 (2003) pp. L20 to L23.

As another example of a known technique that uses a blue LED element, Japanese Unexamined Patent Application, First Publication No. Hei 10-163535 discloses a technique for realizing a white LED using a blue LED element, a fluorescent material that is excited by blue light and emits a green light, and a fluorescent material that is excited by blue light and emits a red light. Furthermore, a white LED that uses $SrGa_2S_4:Eu^{2+}$, which is a fluorescent material that is excited by blue light and emits a green light, and $SrS:Eu^{2+}$, which is a fluorescent material that is excited by blue light and emits a red light, is disclosed in Paul S. Martin, "Performance, Thermal, Cost & Reliability challenges for Solid State Lighting," OIDA Conference, May 30, 2002.

Moreover, as an example of a known technique that uses an ultraviolet LED element, Published Japanese Translation No. 2000-509912 of PCT discloses a technique for realizing a white light having a high color rendering characteristic by using a combination of an ultraviolet LED element, a fluorescent material that is excited by ultraviolet light and emits a blue light, a fluorescent material that is excited by ultraviolet light and emits a green light, and a fluorescent material that is excited by ultraviolet light and emits a red light.

On the other hand, recently, there has been extensive research on oxynitride fluorescent materials and nitride fluorescent materials, and for example, Japanese Unexamined Patent Application, First Publication No. 2002-363554 discloses a europium (Eu)-activated calcium (Ca) solid solution α-SiAlON fluorescent material. This fluorescent material is excited by blue light and emits a yellow light, and can therefore be used favorably as a wavelength conversion material for a white LED. This fluorescent material is described in detail in R. J. Xie, N. Hirosaki, K. Sakuma, Y. Yamamoto, M. Mitomo, "$Eu^{2+}$-doped Ca-α SiAlON: A yellow phosphor for white light-emitting diodes," Appl. Phys. Lett., Vol. 84, pp. 5404 to 5406 (2004). A low color temperature white LED lamp that uses this fluorescent material and exhibits excellent chromaticity stability upon temperature variation is disclosed in K. Sakuma, K. Omichi, N. Kimura, M. Ohashi, D. Tanaka, N. Hirosaki, Y. Yamamoto, R.-J. Xie, T. Suchiro, "Warm-white light-emitting diode with yellowish orange SiAlON ceramic phosphor," Opt. Lett. Vol. 29, pp. 2001 to 2003 (2004).

Conventionally, fluorescent materials have been predominantly oxides or sulfides, and have required further improvement in terms of their durability and their properties under high-temperature environments. In recent years, development efforts have been focused on developing oxynitride fluorescent materials and nitride fluorescent materials that exhibit superior long-term reliability and high-temperature properties. Moreover, although extensive research is also being conducted into solid-state illumination devices that use a combination of a semiconductor light emitting element and a fluorescent material, oxynitride fluorescent materials or sulfide fluorescent materials are the primary materials being researched. However, even if these conventional fluorescent materials are combined appropriately, and a white LED is then fabricated using a combination of these fluorescent materials and a blue LED element, achieving a white LED having a high color rendering characteristic has proven difficult.

On the other hand, although a white LED using an ultraviolet LED element such as that disclosed in Published Japanese Translation No. 2000-509912 of PCT is capable of realizing a superior color rendering characteristic, a significant problem arises in that the ultraviolet light from the light emitting diode element tends to cause degradation of the sealing resin and the package. This is a major problem in terms of the long-term reliability of the device.

Moreover, other problems include possible external leakage of ultraviolet light that has not undergone wavelength conversion, and the fact that the light emission efficiency of an ultraviolet LED element is lower than that of a blue LED element.

SUMMARY OF THE INVENTION

Exemplary embodiments of the present invention takes the above circumstances into consideration, to provide a white LED with a high color rendering characteristic, that uses a blue LED element and has an average color rendering index exceeding 90. However, exemplary embodiments of the present invention need not solve the above problems.

The present invention provides a light emitting device that includes a semiconductor light emitting element that emits a blue light or a blue-violet light, and a fluorescent material that absorbs some or all of the light emitted from the semiconductor light emitting element and emits a fluorescent light of a wavelength different from the absorbed light, wherein the fluorescent material is a mixed fluorescent material obtained by mixing a first fluorescent material that emits a blue-green light or a green light, a second fluorescent material that has a peak emission wavelength longer than that of the first fluorescent material and emits a green light or a yellow-green light, a third fluorescent material that has a 1 peak emission wavelength longer than that of the second fluorescent material and emits a yellow-green light, a yellow light or a yellow-red light, and a fourth fluorescent material that has a peak emission wavelength longer than that of the third fluorescent material and emits a yellow-red light or a red light.

In the light emitting device of the present invention, the first fluorescent material is preferably an oxynitride crystal fluorescent material represented by a general formula $Ba_{x(1-r)}Si_yO_zN_{(2x+4y-2z)/3}:Eu_{xr}$, the second fluorescent material is preferably a europium-activated β-SiAlON fluorescent material, the third fluorescent material is preferably a europium-activated α-SiAlON fluorescent material, and the fourth fluorescent material is preferably a nitride crystal red fluorescent material represented by a general formula $(Ca,Eu)AlSiN_3$.

Further, the above α-SiAlON fluorescent material is preferably represented by a general formula $Ca_qEu_r(Si,Al)_{12}(O,N)_{16}$, wherein the main phase has an α-SiAlON crystal structure, q is not less than 0.75 and not more than 1.0, and r is not less than 0.03 and not more than 0.10.

Furthermore, the above β-SiAlON fluorescent material is preferably represented by a general formula $Eu_s(Si,Al)_{6-s}(O,N)_8$, wherein the main phase has a β-SiAlON crystal structure, and s is not less than 0.011 and not more than 0.019.

Moreover, in the above oxynitride crystal fluorescent material represented by the general formula $Ba_{x(1-r)}Si_yO_zN_{(2x+4y-2z)/3}:Eu_{xr}$, x is preferably not less than 0.8 and not more than 1.2, y is preferably not less than 1.6 and not more than 2.4, z is preferably not less than 1.6 and not more than 2.4, and r is preferably not less than 0.015 and not more than 0.10.

In one aspect of the light emitting device of the present invention, the chromaticity of the light emitted as a result of the color mixing of the light emitted from the semiconductor light emitting element and the fluorescent light emitted from the mixed fluorescent material, indicated in a CIE 1931 XYZ color space chromaticity diagram, is preferably within the incandescent lamp color range represented by the quadrilateral shape connecting a point indicated by coordinates x=0.4775 and y=0.4283, a point indicated by coordinates x=0.4594 and y=0.3971, a point indicated by coordinates x=0.4348 and y=0.4185, and a point indicated by coordinates x=0.4214 and y=0.3887.

For the above light emitting device of the present invention, in the emission spectrum for the light emitted as a result of the color mixing of the light emitted from the semiconductor light emitting element and the fluorescent light emitted from the mixed fluorescent material, the ratio between the emission intensity at a wavelength of 380 to 475 nm, the emission intensity at a wavelength of 475 to 520 nm, the emission intensity at a wavelength of 520 to 560 nm, the emission intensity at a wavelength of 560 to 615 nm and the emission intensity at a wavelength of 615 to 780 nm is preferably 1:1.6:2.4:4.2:9.5.

In the above light emitting device of the present invention, the mixed fluorescent material is preferably a material obtained by mixing the first fluorescent material, the second fluorescent material, the third fluorescent material and the fourth fluorescent material in a mass ratio of (2.5×D/A):(1.9×D/B):(1.5×D/C):1, wherein A is the peak emission intensity of the first fluorescent material, B is the peak emission intensity of the second fluorescent material, C is the peak emission intensity of the third fluorescent material, and D is the peak emission intensity of the fourth fluorescent material, which are measured using a spectrally corrected fluorescence spectrophotometer.

In the above light emitting device of the present invention, the mixed fluorescent material is preferably a material obtained by mixing the first fluorescent material, the second fluorescent material, the third fluorescent material and the fourth fluorescent material in a mass ratio of 6:8:7:3.

In another aspect of the light emitting device of the present invention, the chromaticity of the light emitted as a result of the color mixing of the light emitted from the semiconductor light emitting element and the fluorescent light emitted from the mixed fluorescent material, indicated in a CIE 1931 XYZ color space chromaticity diagram, is preferably within the warm white color range represented by the quadrilateral shape connecting a point indicated by coordinates x=0.4341 and y=0.4233, a point indicated by coordinates x=0.4171 and y=0.3846, a point indicated by coordinates x=0.4021 and y=0.4076, and a point indicated by coordinates x=0.3903 and y=0.3719.

For the above light emitting device of the present invention, in the emission spectrum for the light emitted as a result of the color mixing of the light emitted from the semiconductor light emitting element and the fluorescent light emitted from the mixed fluorescent material, the ratio between the emission intensity at a wavelength of 380 to 475 nm, the emission intensity at a wavelength of 475 to 520 nm, the emission intensity at a wavelength of 520 to 560 nm, the emission intensity at a wavelength of 560 to 615 nm and the emission intensity at a wavelength of 615 to 780 nm is preferably 1:1.0:1.5:2.3:4.6.

In the above light emitting device of the present invention, the mixed fluorescent material is preferably a material obtained by mixing the first fluorescent material, the second fluorescent material, the third fluorescent material and the fourth fluorescent material in a mass ratio of (3.7×D/A):(12.8×D/B):(1.8×D/C):1, wherein A is the peak emission intensity of the first fluorescent material, B is the peak emission intensity of the second fluorescent material, C is the peak emission intensity of the third fluorescent material, and D is the peak emission intensity of the fourth fluorescent material, which are measured using a spectrally corrected fluorescence spectrophotometer.

In the above light emitting device of the present invention, the mixed fluorescent material is preferably a material obtained by mixing the first fluorescent material, the second fluorescent material, the third fluorescent material and the fourth fluorescent material in a mass ratio of 9:12:8:3.

In yet another aspect of the light emitting device of the present invention, the chromaticity of the light emitted as a result of the color mixing of the light emitted from the semiconductor light emitting element and the fluorescent light emitted from the mixed fluorescent material, indicated in a CIE 1931 XYZ color space chromaticity diagram, is preferably within the white color range represented by the quadrilateral shape connecting a point indicated by coordinates x=0.3938 and y=0.4097, a point indicated by coordinates x=0.3805 and y=0.3642, a point indicated by coordinates x=0.3656 and y=0.3905, and a point indicated by coordinates x=0.3584 and y=0.3499.

For the above light emitting device of the present invention, in the emission spectrum for the light emitted as a result of the color mixing of the light emitted from the semiconductor light emitting element and the fluorescent light emitted from the mixed fluorescent material, the ratio between the emission intensity at a wavelength of 380 to 475 nm, the emission intensity at a wavelength of 475 to 520 nm, the emission intensity at a wavelength of 520 to 560 nm, the emission intensity at a wavelength of 560 to 615 nm and the emission intensity at a wavelength of 615 to 780 nm is preferably 1:0.8:1.2:1.6:2.9.

In the above light emitting device of the present invention, the mixed fluorescent material is preferably a material obtained by mixing the first fluorescent material, the second fluorescent material, the third fluorescent material and the fourth fluorescent material in a mass ratio of $(5.5 \times D/A):(3.6 \times D/B):(2.0 \times D/C):1$, wherein A is the peak emission intensity of the first fluorescent material, B is the peak emission intensity of the second fluorescent material, C is the peak emission intensity of the third fluorescent material, and D is the peak emission intensity of the fourth fluorescent material, which are measured using a spectrally corrected fluorescence spectrophotometer.

In the above light emitting device of the present invention, the mixed fluorescent material is preferably a material obtained by mixing the first fluorescent material, the second fluorescent material, the third fluorescent material and the fourth fluorescent material in a mass ratio of 4.5:5:3:1.

In yet another aspect of the light emitting device of the present invention, the chromaticity of the light emitted as a result of the color mixing of the light emitted from the semiconductor light emitting element and the fluorescent light emitted from the mixed fluorescent material, indicated in a CIE 1931 XYZ color space chromaticity diagram, is preferably within the neutral white color range represented by the quadrilateral shape connecting a point indicated by coordinates x=0.3616 and y=0.3875, a point indicated by coordinates x=0.3552 and y=0.3476, a point indicated by coordinates x=0.3353 and y=0.3659, and a point indicated by coordinates x=0.3345 and y=0.3314.

For the above light emitting device of the present invention, in the emission spectrum for the light emitted as a result of the color mixing of the light emitted from the semiconductor light emitting element and the fluorescent light emitted from the mixed fluorescent material, the ratio between the emission intensity at a wavelength of 380 to 475 nm, the emission intensity at a wavelength of 475 to 520 nm, the emission intensity at a wavelength of 520 to 560 nm, the emission intensity at a wavelength of 560 to 615 nm and the emission intensity at a wavelength of 615 to 780 nm is preferably 1:0.8:0.9:1.1:1.7.

In the above light emitting device of the present invention, the mixed fluorescent material is preferably a material obtained by mixing the first fluorescent material, the second fluorescent material, the third fluorescent material and the fourth fluorescent material in a mass ratio of $(7.4 \times D/A):(5.0 \times D/B):(2.3 \times D/C):1$, wherein A is the peak emission intensity of the first fluorescent material, B is the peak emission intensity of the second fluorescent material, C is the peak emission intensity of the third fluorescent material, and D is the peak emission intensity of the fourth fluorescent material, which are measured using a spectrally corrected fluorescence spectrophotometer.

In the above light emitting device of the present invention, the mixed fluorescent material is preferably a material obtained by mixing the first fluorescent material, the second fluorescent material, the third fluorescent material and the fourth fluorescent material in a mass ratio of 6:7:3.5:1.

In yet another aspect of the light emitting device of the present invention, the chromaticity of the light emitted as a result of the color mixing of the light emitted from the semiconductor light emitting element and the fluorescent light emitted from the mixed fluorescent material, indicated in a CIE 1931 XYZ color space chromaticity diagram, is preferably within the daylight color range represented by the quadrilateral shape connecting a point indicated by coordinates x=0.3274 and y=0.3673, a point indicated by coordinates x=0.3282 and y=0.3297, a point indicated by coordinates x=0.2998 and y=0.3396, and a point indicated by coordinates x=0.3064 and y=0.3091.

For the above light emitting device of the present invention, in the emission spectrum for the light emitted as a result of the color mixing of the light emitted from the semiconductor light emitting element and the fluorescent light emitted from the mixed fluorescent material, the ratio between the emission intensity at a wavelength of 380 to 475 nm, the emission intensity at a wavelength of 475 to 520 nm, the emission intensity at a wavelength of 520 to 560 nm, the emission intensity at a wavelength of 560 to 615 nm and the emission intensity at a wavelength of 615 to 780 nm is preferably 1:0.7:0.7:0.9:1.1.

In the above light emitting device of the present invention, the mixed fluorescent material is preferably a material obtained by mixing the first fluorescent material, the second fluorescent material, the third fluorescent material and the fourth fluorescent material in a mass ratio of $(9.8 \times D/A):(6.4 \times D/B):(2.6 \times D/C):1$, wherein A is the peak emission intensity of the first fluorescent material, B is the peak emission intensity of the second fluorescent material, C is the peak emission intensity of the third fluorescent material, and D is the peak emission intensity of the fourth fluorescent material, which are measured using a spectrally corrected fluorescence spectrophotometer.

In the above light emitting device of the present invention, the mixed fluorescent material is preferably a material obtained by mixing the first fluorescent material, the second fluorescent material, the third fluorescent material and the fourth fluorescent material in a mass ratio of 8:9:4:1.

Furthermore, the present invention also provides an illumination device that uses a light emitting device according to the present invention described above as a light source.

A light emitting device of the present invention includes a combination of a semiconductor light emitting element that emits a blue light or a blue-violet light, and a mixed fluorescent material that absorbs some or all of the light emitted from the semiconductor light emitting element and is obtained by mixing a first fluorescent material that emits a blue-green light or a green light, a second fluorescent material that has a peak emission wavelength longer than that of the first fluorescent material and emits a green light or a yellow-green light, a third fluorescent material that has a peak emission wavelength longer than that of the second fluorescent material and emits a yellow-green light, a yellow light or a yellow-red light, and a fourth fluorescent material that has a peak emission wavelength longer than that of the third fluorescent material and emits a yellow-red light or a red light, and as a result, a white LED lamp can be provided that exhibits a high level of reliability, high efficiency, and an extremely high color rendering characteristic.

Furthermore, according to the present invention, by constructing an illumination device using the light emitting device according to the present invention, an illumination device can be provided that exhibits a high level of reliability, high efficiency, and an extremely high color rendering characteristic.

Exemplary embodiments of the present invention may have the above discussed advantages. However, embodiments of the present invention need not have any of these advantages.

DETAILED DESCRIPTION OF EXEMPLARY EMBODIMENTS OF THE INVENTION

Figure 1:
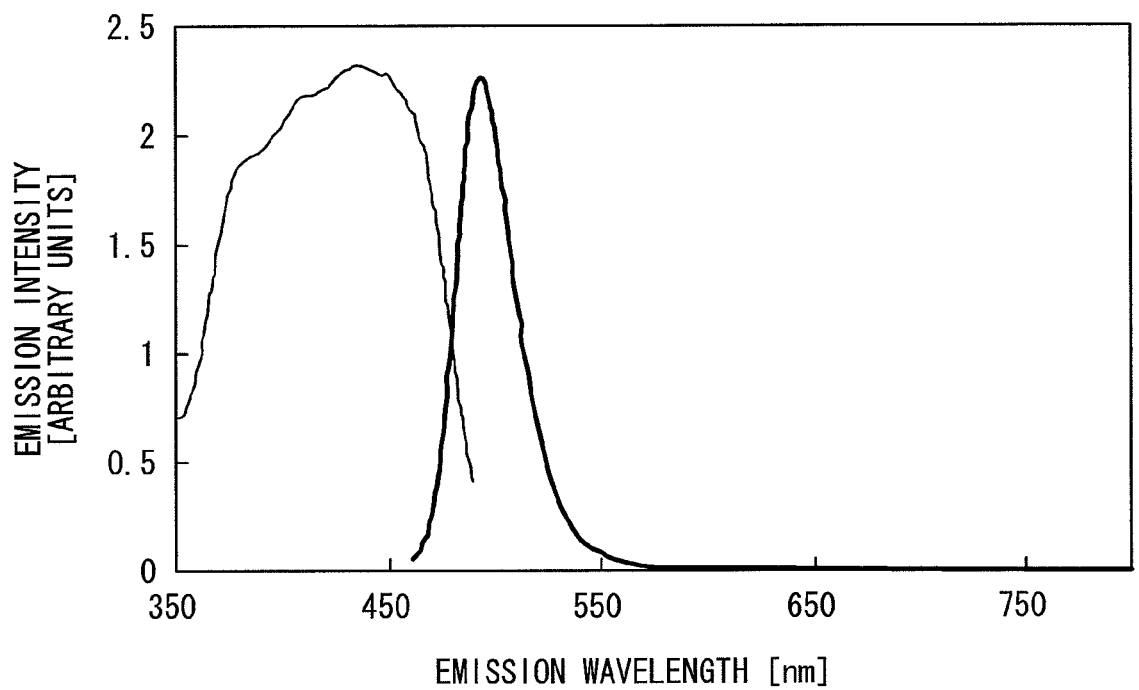
FIG. 1 shows an emission spectrum and an excitation spectrum for an exemplary embodiment of a $(Ba,Eu)Si_2O_2N_2$ fluorescent material that represents a first fluorescent material.

An embodiment of the light emitting device according the present invention will now be described based on the drawings. Note that the present invention is not limited to this embodiment. A light emitting device of the present invention includes a combination of a semiconductor light emitting element that emits a blue light or a blue-violet light, and a mixed fluorescent material that absorbs some or all of the light emitted from the semiconductor light emitting element and is obtained by mixing a first fluorescent material that emits a blue-green light or a green light, a second fluorescent material that has a light emitting peak wavelength longer than that of the first fluorescent material and emits a green light or a yellow-green light, a third fluorescent material that has a light emitting peak wavelength longer than that of the second fluorescent material and emits a yellow-green light, a yellow light or a yellow-red light, and a fourth fluorescent material that has a light emitting peak wavelength longer than that of the third fluorescent material and emits a yellow-red light or a red light.

Described below is a detailed description of white LEDs that represent embodiments of the light emitting device of the present invention. However, the examples presented below are merely exemplary of the present invention, and the present invention is in no way limited by these specific examples.

EXAMPLE 1

First is a description of the first fluorescent material. The first fluorescent material is a europium-activated oxynitride crystal fluorescent material represented by a formula $Ba_{x(1-r)}Si_yO_zN_{(2x+4y-2z)/3}:Eu_{xr}$, which emits either a blue-green light or a green light upon blue light excitation. Synthesis of this oxynitride crystal fluorescent material represented by $Ba_{x(1-r)}Si_yO_zN_{(2x+4y-2z)/3}:Eu_{xr}$ is conducted in the manner described below.

First a calcination was conducted using $Si_3N_4$ powder, $SiO_2$ powder, $BaCO_3$ powder and $Eu_2O_3$ powder as raw material powders. On the basis of the targeted composition, it may be thought that the use of barium nitride or barium oxide would be appropriate for the barium component, but barium nitride is extremely expensive, making it unsuitable for industrial application, whereas barium oxide tends to be partially converted to barium hydroxide and barium carbonate under the action of moisture or carbon dioxide in the air, meaning accurate weighing of the barium component is impossible. Accordingly, in the present example, inexpensive and stable barium carbonate was used, and a method was employed in which, during the calcination, the temperature was held for a predetermined period at the temperature at which carbon dioxide is eliminated from the barium carbonate, thereby converting the barium carbonate to barium oxide prior to the heating performed at the calcination temperature. By using this method, weighing can be performed accurately, and the fluorescent material can be prepared inexpensively.

Based on the results of synthesizing a multitude of samples with different proportions of the $Si_3N_4$, $SiO_2$, $BaCO_3$ and $Eu_2O_3$ within the raw material powder, and then comparing the light emission properties of the various samples, the inventors of the present invention discovered that within a fluorescent material composition range specified by $0.8 \leq x \leq 1.2$, $1.6 \leq y \leq 2.4$, $1.6 \leq z \leq 2.4$ and $0.015 \leq r \leq 0.10$, the emission intensity was particularly strong and the color rendering characteristic was extremely high, making the fluorescent material ideal for application to white LED lamps.

In the present example, values of $x=1.0$, $y=2.0$, $z=2.0$ and $r=0.025$ were selected. In order to achieve a composition represented by $Ba_{0.975}Si_2O_2N_2:Eu_{0.025}$, 23.62% by mass of $Si_3N_4$ powder, 10.12% by mass of $SiO_2$ powder, 64.78% by mass of $BaCO_3$ powder and 1.48% by mass of $Eu_2O_3$ powder were weighed out and mixed together to form a single batch of 50 g. Subsequently, the mixture was placed inside a boron nitride container having a lid, and the covered container containing the raw material powder was introduced into a gas-pressurized sintering furnace. The powder was first held under vacuum at 1,300° C. for 3 hours to eliminate carbon dioxide from the barium carbonate, and was then sintered for 5 hours at a sintering temperature of 1,500° C. and under gas pressurization using a nitrogen atmosphere of 0.5 MPa. Following sintering, the powder had formed a single lump, but this was crushed to a powder form by application of minimal force, thereby yielding a fluorescent powder.

Next is a description of the second fluorescent material. The second fluorescent material is a europium-activated β-SiAlON fluorescent material that has a light emitting wavelength longer than that of the first fluorescent material and emits a green light or a yellow-green light. The synthesis of this europium-activated β-SiAlON fluorescent material is described below.

Typically, β-SiAlON refers to materials represented by a general formula $Si_{6-z}Al_zO_zN_{8-z}$, but in the present invention, the composition is represented by the general formula $Eu_s(Si,Al)_{6-s}(O,N)_8$, and nitride fluorescent materials or oxynitride fluorescent materials having the same crystal structure as β-$Si_3N_4$ or β-SiAlON are referred to as β-SiAlON fluorescent materials.

Based on the results of synthesizing a multitude of samples with different proportions of the $Si_3N_4$, AlN and $Eu_2O_3$ within the raw material powder, and then comparing the light emission properties of the various samples, the inventors of the present invention discovered that favorable light emission properties could be obtained within a range specified by $0.011 \leq s \leq 0.019$, and that particularly favorable properties could be obtained when s=0.013.

In the present example, a composition containing 89 mol % of $Si_3N_4$, 10.7 mol % of AlN and 0.3 mol % of $Eu_2O_3$ was used. Silicon nitride powder, aluminum nitride powder, and europium oxide powder were used as the raw material powders. In order to achieve the above composition 95.82% by mass of the silicon nitride powder, 3.37% by mass of the aluminum nitride powder and 0.81% by mass of the europium oxide powder were weighed out and mixed together to form a single batch of 50 g, n-hexane was added, and the resulting mixture was mixed for 2 hours in a wet planetary ball mill. Subsequently, the mixed raw material powder was dried using a rotary evaporator, crushed thoroughly in a mortar, granulated to an appropriate particle size using a nominal aperture 125 μm stainless steel test sieve prescribed in JIS Z 8801, and then placed inside a boron nitride container having a lid. Subsequently, the covered container containing the raw material powder was introduced into a gas-pressurized sintering furnace, sintered for 2 hours at a sintering temperature of 2,000° C. and under gas pressurization using a nitrogen atmosphere of 0.5 MPa, and then sintered for a further 24 hours at a sintering temperature of 1,700° C. and under gas pressurization using a nitrogen atmosphere of 0.5 MPa. Following sintering, the powder had formed a single lump, but this was crushed to a powder form by application of minimal force, thereby yielding a fluorescent powder.

The third fluorescent material is a europium-activated calcium α-SiAlON fluorescent material that has a light emitting wavelength longer than that of the second fluorescent material and emits a yellow-green light, a yellow light or a yellow-red light. The synthesis of this calcium α-SiAlON fluorescent material is described below.

The above α-SiAlON fluorescent material is a divalent europium (Eu)-activated calcium (Ca) solid solution α-SiAlON fluorescent material, the composition of which is represented by the general formula $Ca_q(Si,Al)_{12}(O,N)_{16}:Eu^{2+}_r$. Based on the results of synthesizing a multitude of samples with different values for q and r, and then comparing the light emission properties of the various samples, the inventors of the present invention discovered that within a fluorescent material composition range specified by $0.75 \leq q \leq 1.0$ and $0.03 \leq r \leq 0.10$, the emission intensity was particularly strong and the emission chromaticity was ideal for application to white LED lamps.

In the present example, values of q=0.875 and r=0.07 were selected. Silicon nitride powder, aluminum nitride powder, calcium carbonate powder and europium oxide powder were used as the raw material powders. In order to achieve a composition represented by the formula $Ca_{0.875}Si_{9.06}Al_{2.94}O_{0.98}N_{15.02}:Eu_{0.07}^{2+}$, 65.78% by mass of the silicon nitride powder, 18.71% by mass of the aluminum nitride powder, 13.59% by mass of the calcium carbonate powder and 1.91% by mass of the europium oxide powder were weighed out and mixed together to form a single batch of 50 g, n-hexane was added, and the resulting mixture was mixed for 2 hours in a wet planetary ball mill. Subsequently, the mixed raw material powder was dried using a rotary evaporator, crushed thoroughly in a mortar, granulated to an appropriate particle size using a nominal aperture 125 μm stainless steel test sieve prescribed in JIS Z 8801, and then placed inside a boron nitride container having a lid. Subsequently, the covered container containing the raw material powder was introduced into a gas-pressurized sintering furnace, and sintered for 24 hours at a sintering temperature of 1,700° C. and under gas pressurization using a nitrogen atmosphere of 0.5 MPa. Following sintering, the powder had formed a single lump, but this was crushed to a powder form by application of minimal force, thereby yielding a fluorescent powder.

The fourth fluorescent material is a nitride crystal fluorescent material represented by a general formula (Ca,Eu)AlSiN₃ that has a light emitting wavelength longer than that of the third fluorescent material and emits a yellow-red light or a red light. The synthesis of this nitride crystal fluorescent material represented by the formula $(Ca,Eu)AlSiN_3$ is described below.

Silicon nitride powder, aluminum nitride powder, calcium nitride powder, and europium nitride that was synthesized by the nitridation of europium metal in ammonia were used as the raw material powders. In order to achieve a composition represented by the compositional formula $EU_{0.0005}Ca_{0.9995}AlSiN_3$, 34.0735% by mass of the silicon nitride powder, 29.8705% by mass of the aluminum nitride powder, 35.9956% by mass of the calcium nitride powder and 0.06048% by mass of the europium nitride powder were weighed out, and following mixing for 30 minutes using an agate pestle and mortar, the resulting mixture was molded under a pressure of 20 MPa using a molding die, thus forming a molded item having a diameter of 12 mm and a thickness of 5 mm. The operations of weighing, mixing, and molding the powders were all conducted within a glove box that is able to be held under a nitrogen atmosphere having a moisture content of not more than 1 ppm and an oxygen concentration of not more than 1 ppm. The molded item was placed in a boron nitride crucible, and then set inside an electric furnace with a graphite resistance heating system. The calcination operation was conducted by first evacuating the calcination atmosphere down to a vacuum using a diffusion pump, heating the furnace from room temperature to 800° C. at a rate of 500° C. per hour, subsequently introducing nitrogen with a purity of 99.999% by volume to raise the pressure to 1 MPa once the temperature had reached 800° C., raising the temperature to 1,800° C. at a rate of 500° C. per hour, and then maintaining the temperature at 1,800° C. for two hours. Following calcination, the sintered product was crushed to a powder using an agate mortar and pestle.

The optical properties of the first fluorescent material, the second fluorescent material, the third fluorescent material and the fourth fluorescent material synthesized in the above manner are described below. Measurement of these optical properties was conducted using a fluorescence spectrophotometer F-4500 manufactured by Hitachi, Ltd. The spectrophotometer was calibrated by the rhodamine B method using a standard light source, and the measurements were conducted with spectral correction.

FIG. 1 shows the emission spectrum and the excitation spectrum for the $(Ba,Eu)Si_2O_2N_2$ fluorescent material of the first fluorescent material.

Figure 2:
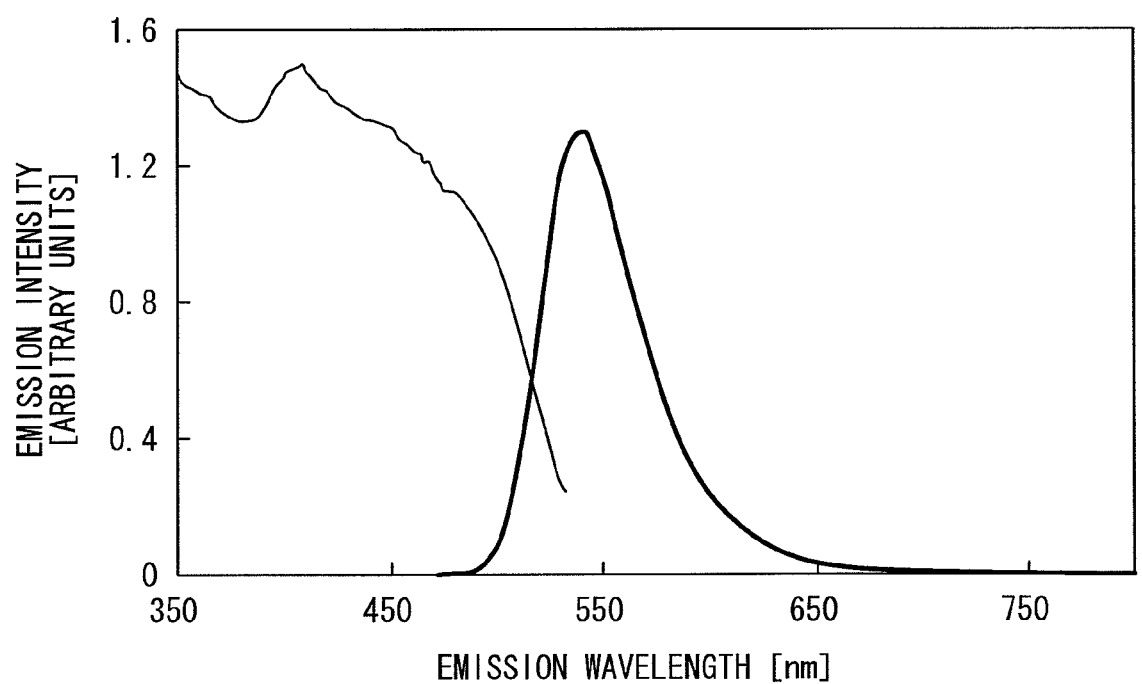
FIG. 2 shows an emission spectrum and an excitation spectrum for an exemplary embodiment of a β-SiAlON fluorescent material that represents a second fluorescent material.

FIG. 2 shows the emission spectrum and the excitation spectrum for the β-SiAlON fluorescent material of the second fluorescent material.

Figure 3:
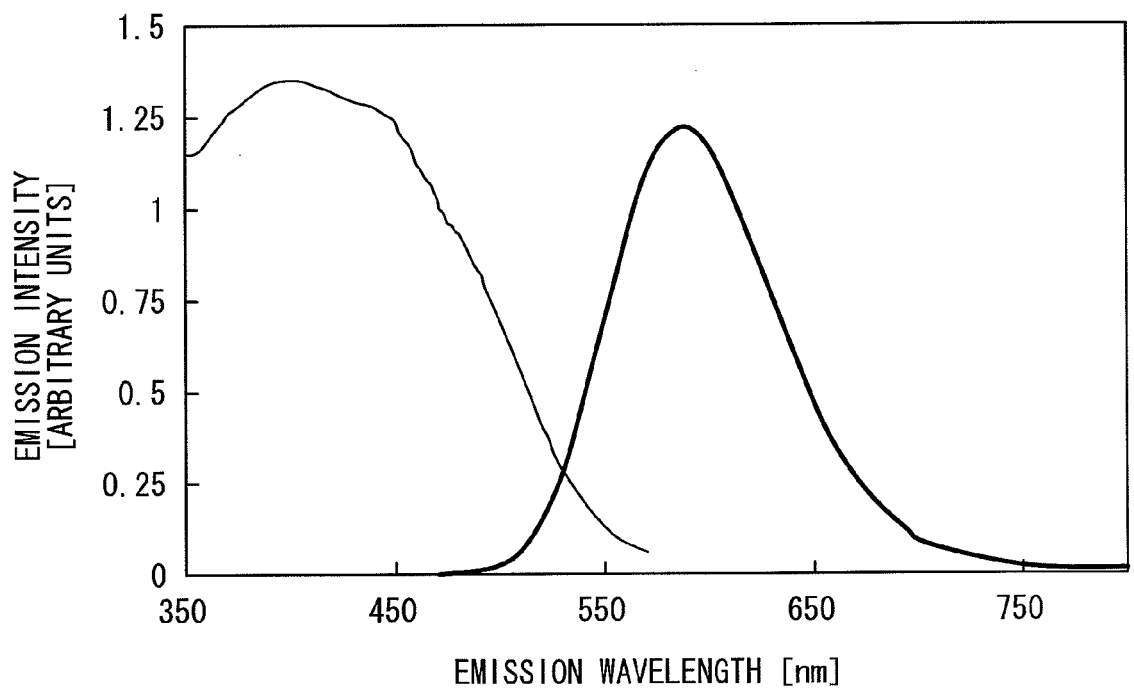
FIG. 3 shows an emission spectrum and an excitation spectrum for an exemplary embodiment of an α-SiAlON fluorescent material that represents a third fluorescent material.

FIG. 3 shows the emission spectrum and the excitation spectrum for the α-SiAlON fluorescent material of the third fluorescent material.

Figure 4:
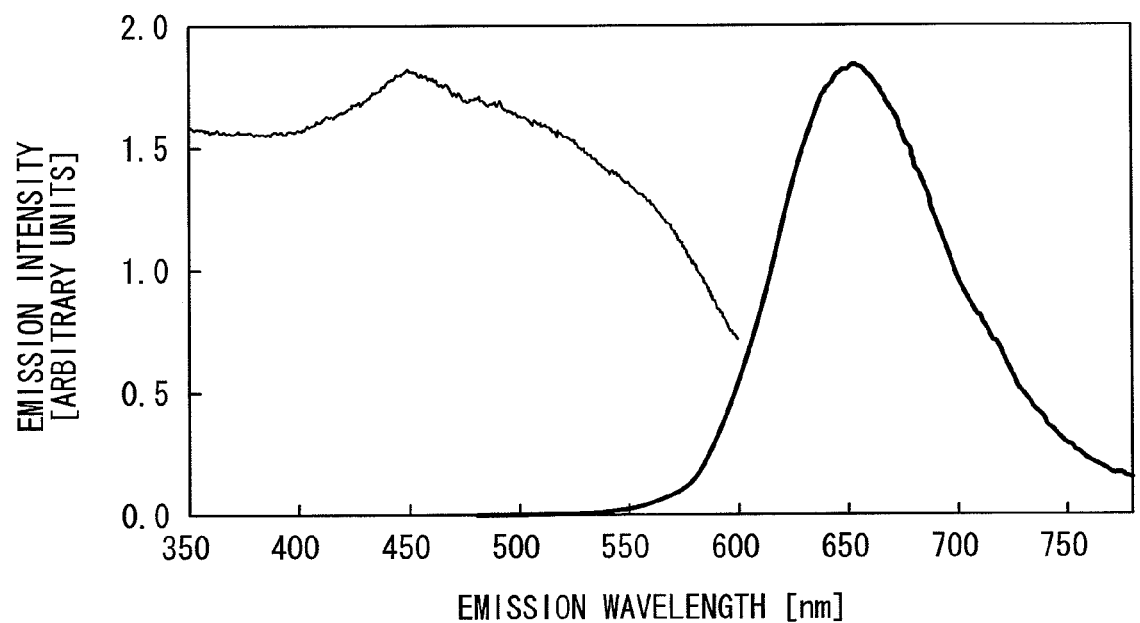
FIG. 4 shows an emission spectrum and an excitation spectrum for an exemplary embodiment of a $(Ca,Eu)AlSiN_3$ fluorescent material that represents a fourth fluorescent material.

FIG. 4 shows the emission spectrum and the excitation spectrum for the $(Ca,Eu)AlSiN_3$ fluorescent material of the fourth fluorescent material.

In FIG. 1 to FIG. 4, the emission spectrum is shown by the bold line and the excitation spectrum is shown by the narrow line in each case. Measurement of the emission spectrum was conducted on the assumption of excitation by the blue light LED, and used an excitation wavelength of 450 nm in each case. Measurement of the excitation spectrum was conducted using the light emitting peak wavelength of the respective fluorescent material as the monitored wavelength. Furthermore, emission intensity on the vertical axis was normalized with the peak emission intensity of a reference fluorescent material being set to 1. The reference fluorescent material was a commercially available $(Y,Gd)_3Al_5O_{12}:Ce^{3+}$ fluorescent powder (a YAG fluorescent material), and the measured result for the intensity when the excitation wavelength was set to 460 nm, which represents the maximum emission intensity for the reference fluorescent material, was used for the normalization.

The light emitting peak wavelengths for the fluorescent materials when an excitation wavelength of 450 nm was used were 493 nm for the $(Ba,Eu)Si_2O_2N_2$ fluorescent material of the first fluorescent material, 539 nm for the β-SiAlON fluorescent material of the second fluorescent material, 589 nm for the α-SiAlON fluorescent material of the third fluorescent material, and 655 nm for the $(Ca,Eu)AlSiN_3$ fluorescent material of the fourth fluorescent material. The emission colors for the first to fourth fluorescent materials determined by these light emitting peak wavelengths, as defined in JIS Z8110, are blue-green for the $(Ba,Eu)Si_2O_2N_2$ fluorescent material of the first fluorescent material, green for the β-SiAlON fluorescent material of the second fluorescent material, yellow-red for the α-SiAlON fluorescent material of the third fluorescent material, and red for the $(Ca,Eu)AlSiN_3$ fluorescent material of the fourth fluorescent material.

In terms of their excitation spectra, all of the fluorescent materials exhibit an extremely broad excitation range that spans from blue light to ultraviolet light. For the α-SiAlON fluorescent material of the third fluorescent material and the $(Ca,Eu)AlSiN_3$ fluorescent material of the fourth fluorescent material, a highly efficient excitation was achieved using blue light having a wavelength in the vicinity of 450 nm. Similarly, for the $(Ba,Eu)Si_2O_2N_2$ fluorescent material of the first fluorescent material, blue light having a wavelength in the vicinity of 450 nm was close to the excitation peak, enabling a highly efficient excitation to be achieved. In the case of the β-SiAlON fluorescent material of the second fluorescent material, the excitation efficiency at 450 nm was satisfactory, although excitation using light of an even shorter wavelength yielded a higher excitation efficiency, and is therefore preferred.

Figure 7:
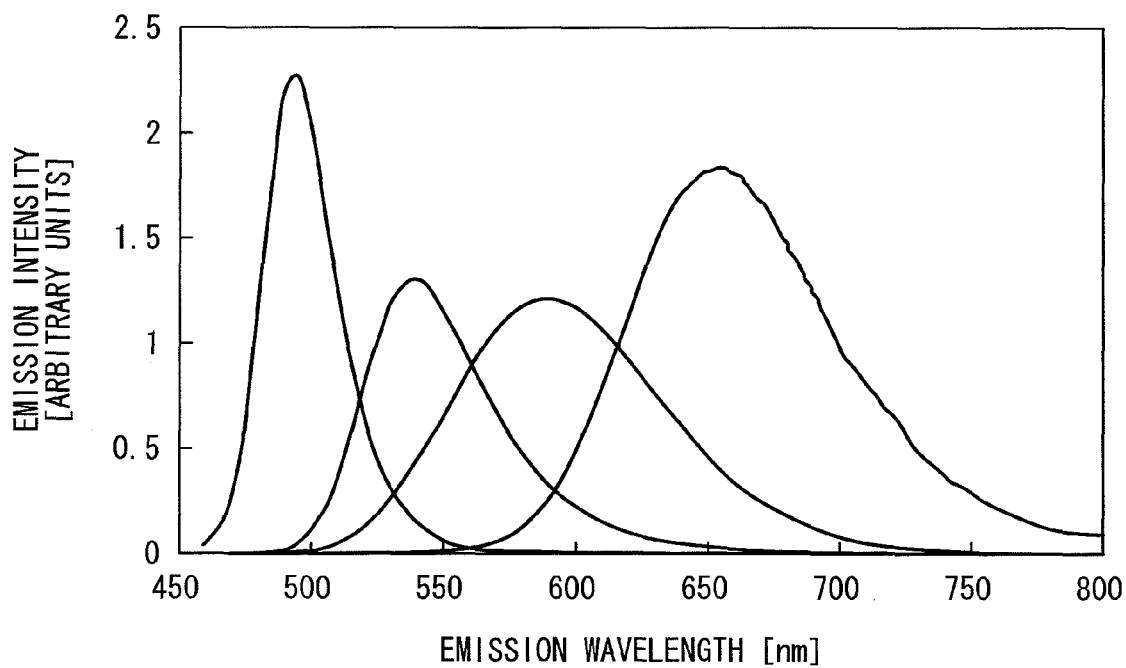
FIG. 7 shows light emission spectra for an exemplary embodiment of the first to fourth fluorescent materials prepared in Example 1.

If the peak emission intensity for the above reference fluorescent material is deemed to be 100%, then the measured peak emission intensities were 226% for the $(Ba,Eu)Si_2O_2N_2$ fluorescent material of the first fluorescent material, 131% for the β-SiAlON fluorescent material of the second fluorescent material, 121% for the α-SiAlON fluorescent material of the third fluorescent material, and 184% for the $(Ca,Eu)AlSiN_3$ fluorescent material of the fourth fluorescent material. FIG. 7 shows a comparison of the light emission spectra for the first to fourth fluorescent materials.

Figure 5:
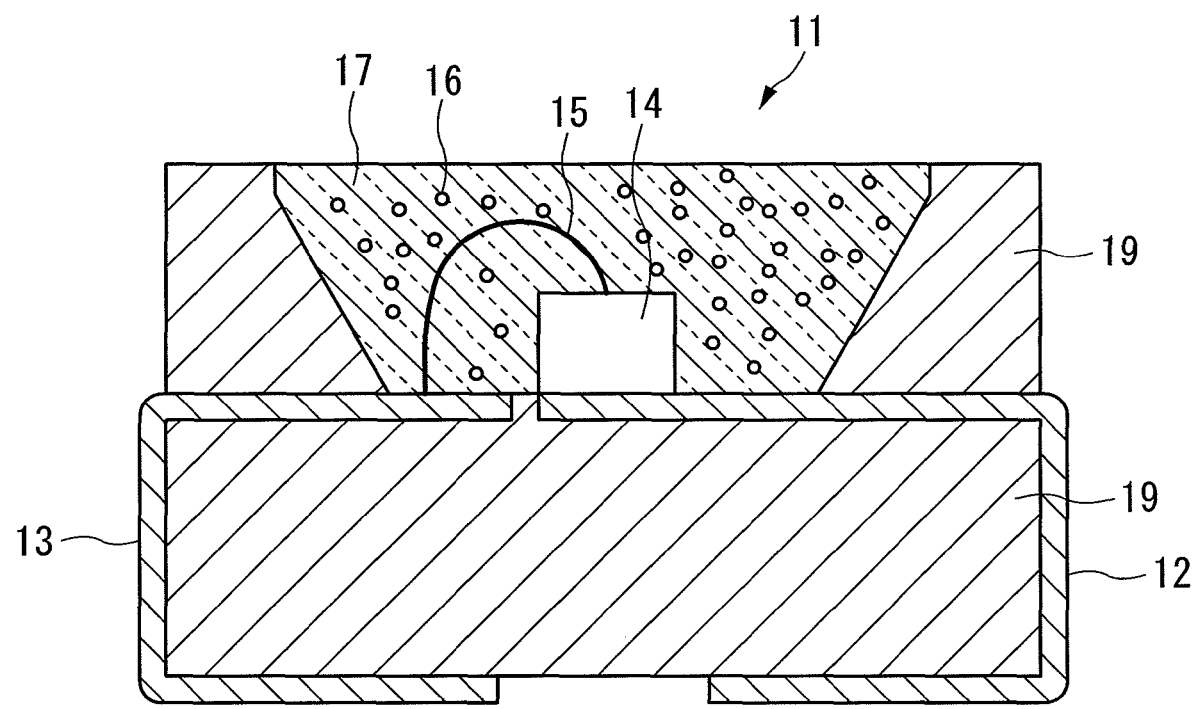
FIG. 5 is a cross-sectional view showing an outline of an exemplary embodiment of the structure of a LED lamp prepared in Example 1.

Next is a description of the structure of a white LED lamp that uses a mixed fluorescent material obtained by mixing the first to fourth fluorescent materials, which is presented as a light emitting device of the present example. FIG. 5 shows a chip LED lamp 11. A white resin package 19 is formed so as to sandwich two lead wires 12 and 13 therein, and has a concave recess in the center of the package. The ends of the lead wires 12 and 13 are exposed within this concave recess, and a blue LED element 14 having a light emitting peak wavelength of 450 nm is also mounted within the recess. The bottom electrode of the blue LED element 14 and the end of the lead wire 12 are connected electrically using a conductive paste. Further, the top electrode of the blue LED element 14 and the end of the lead wire 13 are connected electrically using a bonding wire 15 formed from a thin gold wire. A resin 17, which is formed by dispersing a fluorescent powder 16 prepared by mixing the first fluorescent material, the second fluorescent material, the third fluorescent material and the fourth fluorescent material within a transparent resin, is used to completely cover the blue LED element 14 and seal the entire concave recess including the lead wires 12 and 13. The blue LED element 14 preferably has a light emission central wavelength of 400 to 480 nm, and a light emission central wavelength of 445 to 460 nm is particularly preferred in terms of efficiently exciting the α-SiAlON fluorescent material of the third fluorescent material and the $(Ca,Eu)AlSiN_3$ fluorescent material of the fourth fluorescent material.

The production procedure for this chip LED lamp 11 is described below.

In a first step, the first fluorescent material, the second fluorescent material, the third fluorescent material and the fourth fluorescent material were weighed and mixed.

In a second step, the blue LED element 14 having a light emitting peak wavelength of 450 nm was die bonded to one end of the lead wire 12 using a conductive paste.

In a third step, the blue LED element 14 and the other lead wire 13 were wire-bonded using a thin gold wire.

In a fourth step, the resin 17 having 11% by mass of the mixed fluorescent powder 16 dispersed therein was applied to the concave recess in sufficient quantity to cover the blue LED element 14, and the resin 17 was then cured. At this point, the appropriate application quantity was determined in advance by experimentation. The resin used was a silicone resin.

In the present example, the mixing ratio between the first fluorescent material that emits a blue-green light, the second fluorescent material that emits a green light, the third fluorescent material that emits a yellow-red light and the fourth fluorescent material that emits a red light was set to a mass ratio of 6:8:7:3, resulting in an emission chromaticity of incandescent lamp color. Incandescent lamp color refers to a range, within a CIE 1931 XYZ color space chromaticity diagram, represented by the quadrilateral shape connecting the four points at coordinates (x, y) of (0.4775, 0.4283), (0.4594, 0.3971), (0.4348, 0.4185) and (0.4214, 0.3887).

The incandescent color LED lamp of this example had an incandescent lamp color with coordinates (x, y) of (0.451, 0.415) in the CIE 1931 XYZ color space chromaticity diagram, and the correlated color temperature was 2870 K. The average color rendering index Ra was an extremely high 98. The emission efficiency relative to input power was 23 lm/W. The emission spectrum is shown in FIG. 6.

Figure 6:
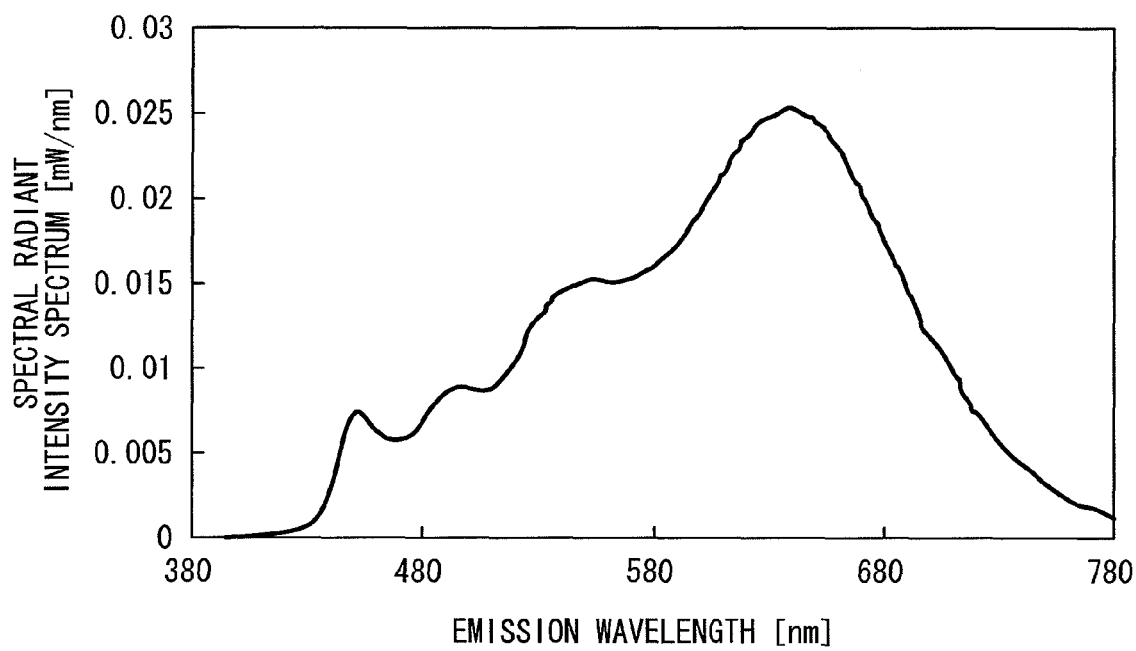
FIG. 6 shows an emission spectrum for an exemplary embodiment of the LED lamp prepared in Example 1.

Based on the emission spectrum of the incandescent color LED lamp shown in FIG. 6 and the comparison of the emission spectra of the first to fourth fluorescent materials shown in FIG. 7, it is evident that for the incandescent color LED lamp prepared in this example, emission from the blue LED element is dominant for light emission in the wavelength region from 380 to 475 nm, emission from the first fluorescent material is dominant for light emission in the wavelength region from 475 to 520 nm, emission from the second fluorescent material is dominant for light emission in the wavelength region from 520 to 560 nm, emission from the third fluorescent material is dominant for light emission in the wavelength region from 560 to 615 nm, and emission from the fourth fluorescent material is dominant for light emission in the wavelength region from 615 to 780 nm. The emission intensities for each of the wavelength regions in the visible light region, for wavelengths from 380 to 475 nm, wavelengths from 475 to 520 nm, wavelengths from 520 to 560 nm, wavelengths from 560 to 615 nm and wavelengths from 615 to 780 nm, namely the ratio of the respective surface areas within the emission spectrum, was 1:1.6:2.4:4.2:9.5.

The mixing ratio of the first to fourth fluorescent materials may require further investigation. The first to fourth fluorescent materials used in the present example are still in the process of review and investigation for improved optical properties, and their emission intensities may also be further improved in the future. In the present example, the emission intensities of the fluorescent materials exhibit the relationship shown in FIG. 7, but if the emission intensity of any of the fluorescent materials is improved in the future, resulting in a change in the proportion of that intensity, then the mixing ratio of the first to fourth fluorescent materials will, of course, also need to be reviewed to ensure that the white LED lamp yields an emission chromaticity of an incandescent lamp color. For example, if the peak emission intensities of the first to fourth fluorescent materials, measured using a spectrally corrected fluorescence spectrophotometer, are deemed A:B:C:D, then the mixing ratio may be set to a mass ratio of $(2.5 \times D/A):(1.9 \times D/B):(1.5 \times D/C):1$.

EXAMPLE 2

In this example, the same first fluorescent material that emits a blue-green light, second fluorescent material that emits a green light, third fluorescent material that emits a yellow-red light and fourth fluorescent material that emits a red light as those used in the above Example 1 were used, and the mixing ratio between these first to fourth fluorescent materials was set to a mass ratio of 9:12:8:3, thereby yielding an emission chromaticity with a warm white color.

The warm white color refers to a range, within a CIE 1931 XYZ color space chromaticity diagram, represented by the quadrilateral shape connecting the four points at coordinates (x, y) of (0.4341, 0.4233), (0.4171, 0.3846), (0.4021, 0.4076) and (0.3903, 0.3719).

With the exception of this change, a warm white LED lamp was prepared in the same manner as Example 1, and the emission spectrum of the lamp was measured.

Figure 8:
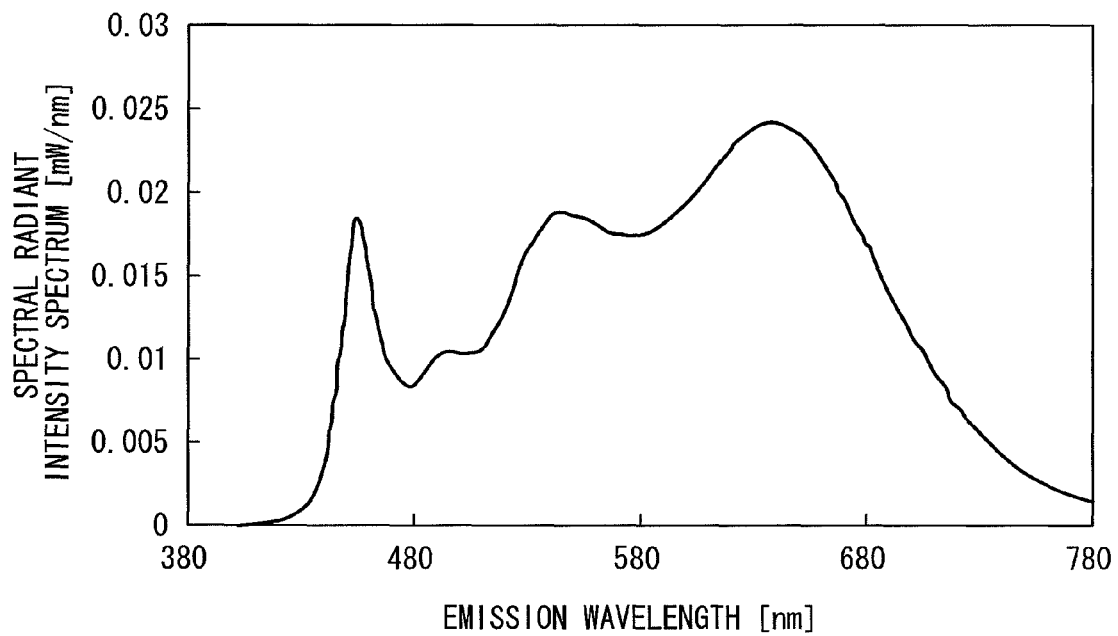
FIG. 8 shows an emission spectrum for an exemplary embodiment of a LED lamp prepared in Example 2.

The warm white LED lamp of this example had a warm white color with coordinates (x, y) of (0.413, 0.397) in the CIE 1931 XYZ color space chromaticity diagram, and the correlated color temperature was 3500 K. The average color rendering index Ra was 96, an extremely high value similar to that observed for the incandescent lamp color of Example 1. The emission efficiency relative to input power was 25 lm/W. The emission spectrum is shown in FIG. 8.

In a similar manner to that described above for Example 1, for the LED lamp of the present example, emission from the blue LED element is dominant for light emission in the wavelength region from 380 to 475 nm, emission from the first fluorescent material is dominant for light emission in the wavelength region from 475 to 520 nm, emission from the second fluorescent material is dominant for light emission in the wavelength region from 520 to 560 nm, emission from the third fluorescent material is dominant for light emission in the wavelength region from 560 to 615 nm, and emission from the fourth fluorescent material is dominant for light emission in the wavelength region from 615 to 780 nm. The emission intensities for each of the wavelength regions in the visible light region, for wavelengths from 380 to 475 nm, wavelengths from 475 to 520 nm, wavelengths from 520 to 560 nm, wavelengths from 560 to 615 nm and wavelengths from 615 to 780 nm, namely the ratio of the respective surface areas within the emission spectrum, was 1:1.0:1.5:2.3:4.6.

The mixing ratio of the first to fourth fluorescent materials may require further investigation. The first to fourth fluorescent materials used in the present example are still in the process of review and investigation for improved optical properties, and their emission intensities may also be further improved in the future. In the present example, the emission intensities of the fluorescent materials exhibit the relationship shown in FIG. 7, but if the emission intensity of any of the fluorescent materials is improved in the future, resulting in a change in the proportion of that intensity, then the mixing ratio of the first to fourth fluorescent materials will, of course, also need to be reviewed to ensure that the white LED lamp yields an emission chromaticity of a warm white color. For example, if the peak emission intensities of the first to fourth fluorescent materials, measured using a spectrally corrected fluorescence spectrophotometer, are deemed A:B:C:D, then the mixing ratio may be set to a mass ratio of $(3.7 \times D/A):(12.8 \times D/B):(1.8 \times D/C):1$.

EXAMPLE 3

In this example, the same first fluorescent material that emits a blue-green light, second fluorescent material that emits a green light, third fluorescent material that emits a yellow-red light and fourth fluorescent material that emits a red light as those used in the above Example 1 were used, and the mixing ratio between these first to fourth fluorescent materials was set to a mass ratio of 4.5:5:3:1, thereby yielding an emission chromaticity with a white color.

The white color refers to a range, within a CIE 1931 XYZ color space chromaticity diagram, represented by the quadrilateral shape connecting the four points at coordinates (x, y) of (0.3938, 0.4097), (0.3805, 0.3642), (0.3656, 0.3905) and (0.3584, 0.3499).

With the exception of this change, a white LED lamp was prepared in the same manner as Example 1, and the emission spectrum of the lamp was measured.

Figure 9:
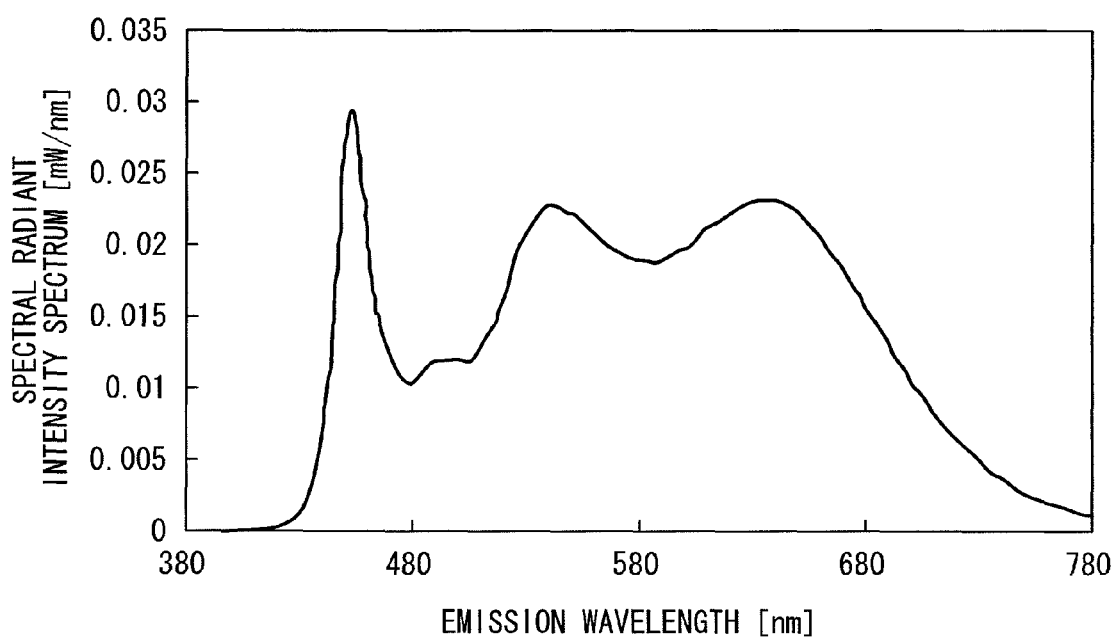
FIG. 9 shows an emission spectrum for an exemplary embodiment of a LED lamp prepared in Example 3.

The white LED lamp of this example had a white color with coordinates (x, y) of (0.376, 0.378) in the CIE 1931 XYZ color space chromaticity diagram, and the correlated color temperature was 4130 K. The average color rendering index Ra was 95, an extremely high value similar to that observed for the incandescent lamp color of Example 1. The emission efficiency relative to input power was 27 lm/W. The emission spectrum is shown in FIG. 9.

In a similar manner to that described above for Example 1, for the LED lamp of the present example, emission from the blue LED element is dominant for light emission in the wavelength region from 380 to 475 nm, emission from the first fluorescent material is dominant for light emission in the wavelength region from 475 to 520 nm, emission from the second fluorescent material is dominant for light emission in the wavelength region from 520 to 560 nm, emission from the third fluorescent material is dominant for light emission in the wavelength region from 560 to 615 nm, and emission from the fourth fluorescent material is dominant for light emission in the wavelength region from 615 to 780 nm. The emission intensities for each of the wavelength regions in the visible light region, for wavelengths from 380 to 475 nm, wavelengths from 475 to 520 nm, wavelengths from 520 to 560 nm, wavelengths from 560 to 615 nm and wavelengths from 615 to 780 nm, namely the ratio of the respective surface areas within the emission spectrum, was 1:0.8:1.2:1.6:2.9.

The mixing ratio of the first to fourth fluorescent materials may require further investigation. The first to fourth fluorescent materials used in the present example are still in the process of review and investigation for improved optical properties, and their emission intensities may also be further improved in the future. In the present example, the emission intensities of the fluorescent materials exhibit the relationship shown in FIG. 7, but if the emission intensity of any of the fluorescent materials is improved in the future, resulting in a change in the proportion of that intensity, then the mixing ratio of the first to fourth fluorescent materials will, of course, also need to be reviewed to ensure that the white LED lamp yields an emission chromaticity of white color. For example, if the peak emission intensities of the first to fourth fluorescent materials, measured using a spectrally corrected fluorescence spectrophotometer, are deemed A:B:C:D, then the mixing ratio may be set to a mass ratio of $(5.5 \times D/A):(3.6 \times D/B):(2.0 \times D/C):1$.

EXAMPLE 4

In this example, the same first fluorescent material that emits a blue-green light, second fluorescent material that emits a green light, third fluorescent material that emits a yellow-red light and fourth fluorescent material that emits a red light as those used in the above Example 1 were used, and the mixing ratio between these first to fourth fluorescent materials was set to a mass ratio of 6:7:3.5:1, thereby yielding an emission chromaticity with a neutral white color.

The neutral white color refers to a range, within a CIE 1931 XYZ color space chromaticity diagram, represented by the quadrilateral shape connecting the four points at coordinates (x, y) of (0.3616, 0.3875), (0.3552, 0.3476), (0.3353, 0.3659) and (0.3345, 0.3314).

With the exception of this change, a neutral white LED lamp was prepared in the same manner as Example 1, and the emission spectrum of the lamp was measured.

Figure 10:
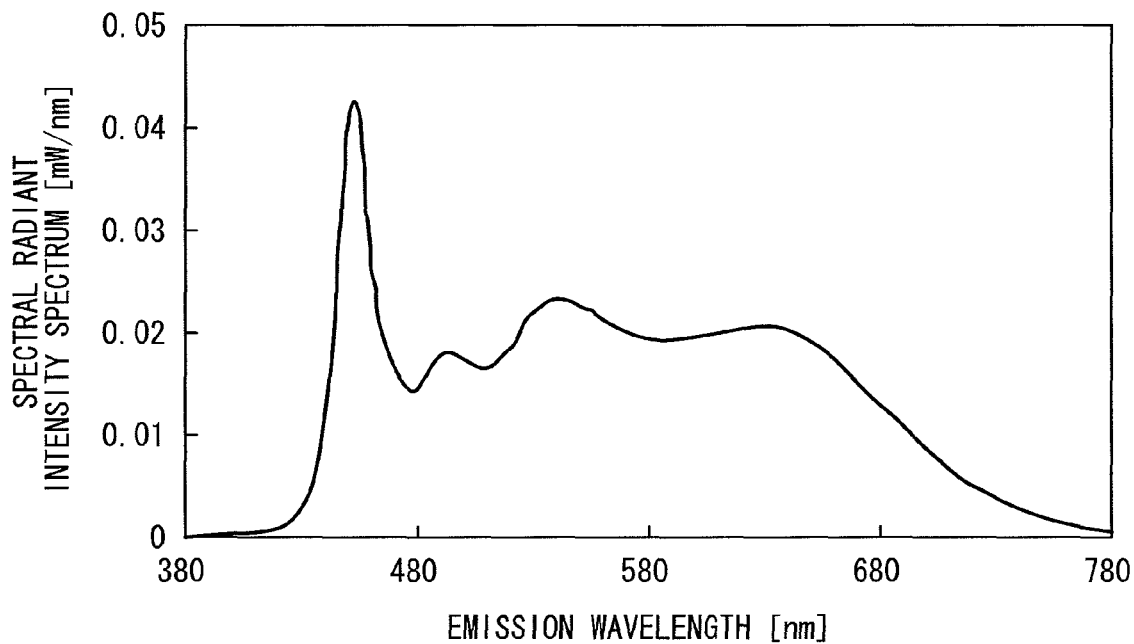
FIG. 10 shows an emission spectrum for an exemplary embodiment of a LED lamp prepared in Example 4.

The neutral white LED lamp of this example had a neutral white color with coordinates (x, y) of (0.343, 0.353) in the CIE 1931 XYZ color space chromaticity diagram, and the correlated color temperature was 5380 K. The average color rendering index Ra was 96, an extremely high value similar to that observed for the incandescent lamp color of Example 1. The emission efficiency relative to input power was 29 lm/W. The emission spectrum is shown in FIG. 10.

In a similar manner to that described above for Example 1, for the LED lamp of the present example, emission from the blue LED element is dominant for light emission in the wavelength region from 380 to 475 nm, emission from the first fluorescent material is dominant for light emission in the wavelength region from 475 to 520 nm, emission from the second fluorescent material is dominant for light emission in the wavelength region from 520 to 560 nm, emission from the third fluorescent material is dominant for light emission in the wavelength region from 560 to 615 nm, and emission from the fourth fluorescent material is dominant for light emission in the wavelength region from 615 to 780 nm. The emission intensities for each of the wavelength regions in the visible light region, for wavelengths from 380 to 475 nm, wavelengths from 475 to 520 nm, wavelengths from 520 to 560 nm, wavelengths from 560 to 615 nm and wavelengths from 615 to 780 nm, namely the ratio of the respective surface areas within the emission spectrum, was 1:0.8:0.9:1.1:1.7.

The mixing ratio of the first to fourth fluorescent materials may require further investigation. The first to fourth fluorescent materials used in the present example are still in the process of review and investigation for improved optical properties, and their emission intensities may also be further improved in the future. In the present example, the emission intensities of the fluorescent materials exhibit the relationship shown in FIG. 7, but if the emission intensity of any of the fluorescent materials is improved in the future, resulting in a change in the proportion of that intensity, then the mixing ratio of the first to fourth fluorescent materials will, of course, also need to be reviewed to ensure that the white LED lamp yields an emission chromaticity of a neutral white color. For example, if the peak emission intensities of the first to fourth fluorescent materials, measured using a spectrally corrected fluorescence spectrophotometer, are deemed A:B:C:D, then the mixing ratio may be set to a mass ratio of $(7.4 \times D/A):(5.0 \times D/B):(2.3 \times D/C):1$.

EXAMPLE 5

In this example, the same first fluorescent material that emits a blue-green light, second fluorescent material that emits a green light, third fluorescent material that emits a yellow-red light and fourth fluorescent material that emits a red light as those used in the above Example 1 were used, and the mixing ratio between these first to fourth fluorescent materials was set to a mass ratio of 8:9:4:1, thereby yielding an emission chromaticity with a daylight color.

The daylight color refers to a range, within a CIE 1931 XYZ color space chromaticity diagram, represented by the quadrilateral shape connecting the four points at coordinates (x, y) of (0.3274, 0.3673), (0.3282, 0.3297), (0.2998, 0.3396) and (0.3064, 0.3091).

With the exception of this change, a daylight color LED lamp was prepared in the same manner as Example 1, and the emission spectrum of the lamp was measured.

Figure 11:
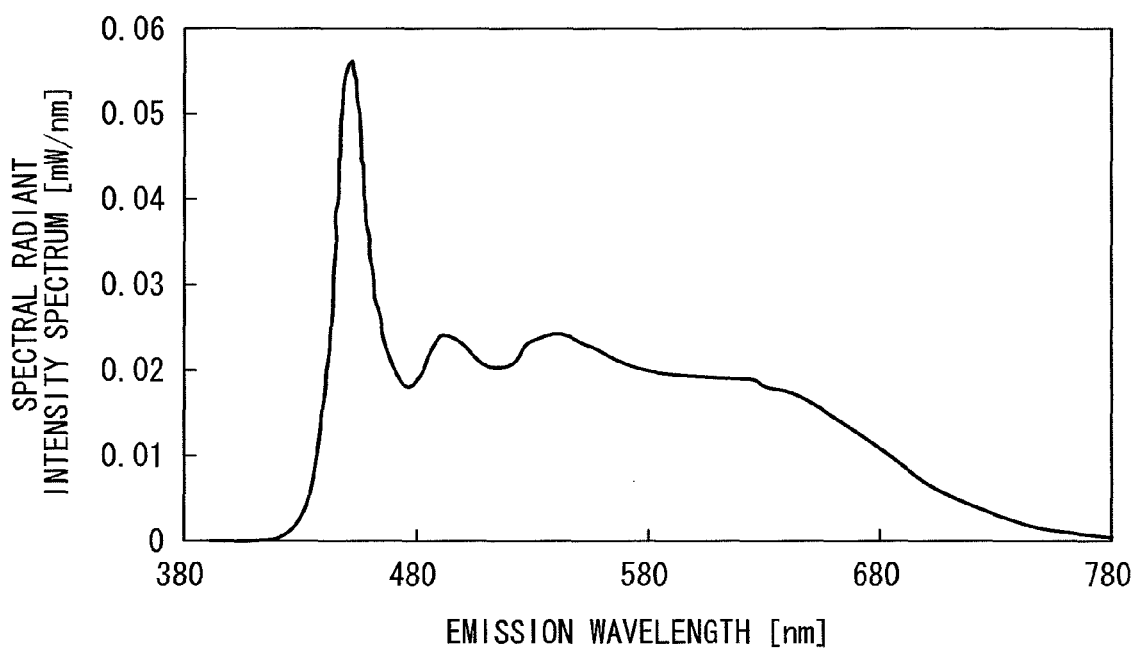
FIG. 11 shows an emission spectrum for an exemplary embodiment of a LED lamp prepared in Example 5.

The daylight color LED lamp of this example had a white color with coordinates (x, y) of (0.311, 0.328) in the CIE 1931 XYZ color space chromaticity diagram, and the correlated color temperature was 6630 K. The average color rendering index Ra was 96, an extremely high value similar to that observed for the incandescent lamp color of Example 1. The emission efficiency relative to input power was 31 lm/W. The emission spectrum is shown in FIG. 11.

In a similar manner to that described above for Example 1, for the LED lamp of the present example, emission from the blue LED element is dominant for light emission in the wavelength region from 380 to 475 nm, emission from the first fluorescent material is dominant for light emission in the wavelength region from 475 to 520 nm, emission from the second fluorescent material is dominant for light emission in the wavelength region from 520 to 560 nm, emission from the third fluorescent material is dominant for light emission in the wavelength region from 560 to 615 nm, and emission from the fourth fluorescent material is dominant for light emission in the wavelength region from 615 to 780 nm. The emission intensities for each of the wavelength regions in the visible light region, for wavelengths from 380 to 475 nm, wavelengths from 475 to 520 nm, wavelengths from 520 to 560 nm, wavelengths from 560 to 615 nm and wavelengths from 615 to 780 nm, namely the ratio of the respective surface areas within the emission spectrum, was 1:0.7:0.7:0.9:1.1.

The mixing ratio of the first to fourth fluorescent materials may require further investigation. The first to fourth fluorescent materials used in the present example are still in the process of review and investigation for improved optical properties, and their emission intensities may also be further improved in the future. In the present example, the emission intensities of the fluorescent materials exhibit the relationship shown in FIG. 7, but if the emission intensity of any of the fluorescent materials is improved in the future, resulting in a change in the proportion of that intensity, then the mixing ratio of the first to fourth fluorescent materials will, of course, also need to be reviewed to ensure that the white LED lamp yields an emission chromaticity of a daylight color. For example, if the peak emission intensities of the first to fourth fluorescent materials, measured using a spectrally corrected fluorescence spectrophotometer, are deemed A:B:C:D, then the mixing ratio may be set to a mass ratio of $(9.8\times D/A):(6.4\times D/B):(2.6\times D/C):1$.

The light emitting device of the present invention is able to provide a white LED lamp and an illumination device that exhibit high levels of reliability, high efficiency, and an extremely high color rendering characteristic. Accordingly, the present invention is extremely useful industrially.

The invention claimed is:

1. A light emitting device comprising:
   a semiconductor light emitting element that emits light having a central wavelength of 445-480 nm, and
   a fluorescent material that absorbs at least some of said light emitted from said semiconductor light emitting element and emits a fluorescent light of a wavelength different from said light,
   wherein said fluorescent material is a mixed fluorescent material obtained by mixing:
      a first fluorescent material that emits a blue-green light or a green light,
      a second fluorescent material that has a light emitting peak wavelength longer than that of said first fluorescent material and emits a green light or a yellow-green light,
      a third fluorescent material that has a light emitting peak wavelength longer than that of said second fluorescent material and emits a yellow-green light, a yellow light or a yellow-red light,
      a fourth fluorescent material that has a light emitting peak wavelength longer than that of said third fluorescent material and emits a yellow-red light or a red light,
   wherein colors of the light emitted from the semiconductor light emitting element and the fluorescent light emitted from the mixed fluorescent material are mixed
   wherein said first fluorescent material is an oxynitride crystal fluorescent material represented by a general formula $Ba_{x(1-r)}Si_yO_zN_{(2x+4y-2z)/3}:Eu_{xr}$,
   wherein said second fluorescent material is a europium-activated β-SiAlON fluorescent material,
   wherein said third fluorescent material is a europium-activated α-SiAlON fluorescent material,
   wherein said fourth fluorescent material is a nitride crystal red fluorescent material represented by a general formula $(Ca,Eu)AlSiN_3$,
   wherein said α-SiAlON fluorescent material is represented by a general formula $Ca_qEu_r(Si,Al)_{12}(O,N)_{16}$, in which a main phase has an α-SiAlON crystal structure, q is not less than 0.75 and not more than 1.0, and r is not less than 0.03 and not more than 0.10,
   wherein said β-SiAlON fluorescent material is represented by a general formula $Eu_s(Si,Al)_{6-s}(O,N)_8$, in which a main phase has a β-SiAlON crystal structure, and s is not less than 0.011 and not more than 0.019, and
   wherein for said oxynitride crystal fluorescent material represented by said general formula $Ba_{x(1-r)}Si_yO_zN_{(2x+4y-2z)/3}:Eu_{xr}$, x is not less than 0.8 and not more than 1.2, y is not less than 1.6 and not more than 2.4, z is not less than 1.6 and not more than 2.4, and r is not less than 0.015 and not more than 0.10.

2. The light emitting device according to claim 1, wherein a chromaticity of light emitted as a result of color mixing of light emitted from said semiconductor light emitting element and fluorescent light emitted from said mixed fluorescent material, indicated in a CIE 1931 XYZ color space chromaticity diagram, is within an incandescent lamp color range represented by a quadrilateral shape connecting a point indicated by coordinates x=0.4775 and y=0.4283, a point indicated by coordinates x=0.4594 and y=0.3971, a point indicated by coordinates x=0.4348 and y=0.4185, and a point indicated by coordinates x=0.4214 and y=0.3887.

3. The light emitting device according to claim 1, wherein in an emission spectrum for light emitted as a result of color mixing of light emitted from said semiconductor light emitting element and fluorescent light emitted from said mixed fluorescent material, a ratio between an emission intensity at a wavelength of 380 to 475 nm, an emission intensity at a wavelength of 475 to 520 nm, an emission intensity at a wavelength of 520 to 560 nm, an emission intensity at a wavelength of 560 to 615 nm, and an emission intensity at a wavelength of 615 to 780 nm is 1:1.6:2.4:4.2:9.5.

4. The light emitting device according to claim 1, wherein said mixed fluorescent material is a material obtained by mixing said first fluorescent material, said second fluorescent material, said third fluorescent material and said fourth fluorescent material in a mass ratio of $(2.5\times D/A):(1.9\times D/B):(1.5\times D/C):1$, wherein A is a peak emission intensity of said first fluorescent material, B is a peak emission intensity of said second fluorescent material, C is a peak emission intensity of said third fluorescent material, and D is a peak emission intensity of said fourth fluorescent material, which are measured using a spectrally corrected fluorescence spectrophotometer.

5. The light emitting device according to claim 1, wherein said mixed fluorescent material is a material obtained by mixing said first fluorescent material, said second fluorescent material, said third fluorescent material and said fourth fluorescent material in a mass ratio of 6:8:7:3.

6. The light emitting device according to claim 1, wherein a chromaticity of light emitted as a result of color mixing of light emitted from said semiconductor light emitting element and fluorescent light emitted from said mixed fluorescent material, indicated in a CIE 1931 XYZ color space chromaticity diagram, is within a warm white color range represented by a quadrilateral shape connecting a point indicated by coordinates x=0.4341 and y=0.4233, a point indicated by coordinates x=0.4171 and y=0.3846, a point indicated by coordinates x=0.4021 and y=0.4076, and a point indicated by coordinates x=0.3903 and y=0.3719.

7. The light emitting device according to claim 1, wherein in an emission spectrum for light emitted as a result of color mixing of said light emitted from said semiconductor light emitting element and said fluorescent light emitted from said mixed fluorescent material, a ratio between an emission intensity at a wavelength of 380 to 475 nm, an emission intensity at a wavelength of 475 to 520 nm, an emission intensity at a wavelength of 520 to 560 nm, an emission intensity at a wavelength of 560 to 615 nm, and an emission intensity at a wavelength of 615 to 780 nm is 1:1.0:1.5:2.3:4.6.

8. The light emitting device according to claim 1, wherein said mixed fluorescent material is a material obtained by mixing said first fluorescent material, said second fluorescent material, said third fluorescent material and said fourth fluorescent material in a mass ratio of $(3.7 \times D/A):(12.8 \times D/B):(1.8 \times D/C):1$, wherein A is a peak emission intensity of said first fluorescent material, B is a peak emission intensity of said second fluorescent material, C is a peak emission intensity of said third fluorescent material, and D is a peak emission intensity of said fourth fluorescent material, which are measured using a spectrally corrected fluorescence spectrophotometer.

9. The light emitting device according to claim 1, wherein said mixed fluorescent material is a material obtained by mixing said first fluorescent material, said second fluorescent material, said third fluorescent material and said fourth fluorescent material in a mass ratio of 9:12:8:3.

10. The light emitting device according to claim 1, wherein a chromaticity of light emitted as a result of color mixing of light emitted from said semiconductor light emitting element and fluorescent light emitted from said mixed fluorescent material, indicated in a CIE 1931 XYZ color space chromaticity diagram, is within a white color range represented by a quadrilateral shape connecting a point indicated by coordinates x=0.3938 and y=0.4097, a point indicated by coordinates x=0.3805 and y=0.3642, a point indicated by coordinates x=0.3656 and y=0.3905, and a point indicated by coordinates x=0.3584 and y=0.3499.

11. The light emitting device according to claim 1, wherein in an emission spectrum for light emitted as a result of color mixing of said light emitted from said semiconductor light emitting element and said fluorescent light emitted from said mixed fluorescent material, a ratio between an emission intensity at a wavelength of 380 to 475 nm, an emission intensity at a wavelength of 475 to 520 nm, an emission intensity at a wavelength of 520 to 560 nm, an emission intensity at a wavelength of 560 to 615 nm, and an emission intensity at a wavelength of 615 to 780 nm is 1:0.8:1.2:1.6:2.9.

12. The light emitting device according to claim 1, wherein said mixed fluorescent material is a material obtained by mixing said first fluorescent material, said second fluorescent material, said third fluorescent material and said fourth fluorescent material in a mass ratio of $(5.5 \times D/A):(3.6 \times D/B):(2.0 \times D/C):1$, wherein A is a peak emission intensity of said first fluorescent material, B is a peak emission intensity of said second fluorescent material, C is a peak emission intensity of said third fluorescent material, and D is a peak emission intensity of said fourth fluorescent material, which are measured using a spectrally corrected fluorescence spectrophotometer.

13. The light emitting device according to claim 1, wherein said mixed fluorescent material is a material obtained by mixing said first fluorescent material, said second fluorescent material, said third fluorescent material and said fourth fluorescent material in a mass ratio of 4.5:5:3:1.

14. The light emitting device according to claim 1, wherein a chromaticity of light emitted as a result of color mixing of light emitted from said semiconductor light emitting element and fluorescent light emitted from said mixed fluorescent material, indicated in a CIE 1931 XYZ color space chromaticity diagram, is within a neutral white color range represented by a quadrilateral shape connecting a point indicated by coordinates x=0.3616 and y=0.3875, a point indicated by coordinates x=0.3552 and y=0.3476, a point indicated by coordinates x=0.3353 and y=0.3659, and a point indicated by coordinates x=0.3345 and y=0.3314.

15. The light emitting device according to claim 1, wherein in an emission spectrum for light emitted as a result of color mixing of said light emitted from said semiconductor light emitting element and said fluorescent light emitted from said mixed fluorescent material, a ratio between an emission intensity at a wavelength of 380 to 475 nm, an emission intensity at a wavelength of 475 to 520 nm, an emission intensity at a wavelength of 520 to 560 nm, an emission intensity at a wavelength of 560 to 615 nm, and an emission intensity at a wavelength of 615 to 780 nm is 1:0.8:0.9:1.1:1.7.

16. The light emitting device according to claim 1, wherein said mixed fluorescent material is a material obtained by mixing said first fluorescent material, said second fluorescent material, said third fluorescent material and said fourth fluorescent material in a mass ratio of $(7.4 \times D/A):(5.0 \times D/B):(2.3 \times D/C):1$, wherein A is a peak emission intensity of said first fluorescent material, B is a peak emission intensity of said second fluorescent material, C is a peak emission intensity of said third fluorescent material, and D is a peak emission intensity of said fourth fluorescent material, which are measured using a spectrally corrected fluorescence spectrophotometer.

17. The light emitting device according to claim 1, wherein said mixed fluorescent material is a material obtained by mixing said first fluorescent material, said second fluorescent material, said third fluorescent material and said fourth fluorescent material in a mass ratio of 6:7:3.5:1.

18. The light emitting device according to claim 1, wherein a chromaticity of light emitted as a result of color mixing of light emitted from said semiconductor light emitting element and fluorescent light emitted from said mixed fluorescent material, indicated in a CIE 1931 XYZ color space chromaticity diagram, is within a daylight color range represented by a quadrilateral shape connecting a point indicated by coordinates x=0.3274 and y=0.3673, a point indicated by coordinates x=0.3282 and y=0.3297, a point indicated by coordinates x=0.2998 and y=0.3396, and a point indicated by coordinates x=0.3064 and y=0.3091.

19. The light emitting device according to claim 1, wherein in an emission spectrum for light emitted as a result of color mixing of said light emitted from said semiconductor light emitting element and said fluorescent light emitted from said mixed fluorescent material, a ratio between an emission intensity at a wavelength of 380 to 475 nm, an emission intensity at a wavelength of 475 to 520 nm, an emission intensity at a wavelength of 520 to 560 nm, an emission intensity at a wavelength of 560 to 615 nm, and an emission intensity at a wavelength of 615 to 780 nm is 1:0.7:0.7:0.9:1.1.

20. The light emitting device according to claim 1, wherein said mixed fluorescent material is a material obtained by mixing said first fluorescent material, said second fluorescent material, said third fluorescent material and said fourth fluorescent material in a mass ratio of $(9.8 \times D/A):(6.4 \times D/B):(2.6 \times D/C):1$, wherein A is a peak emission intensity of said first fluorescent material, B is a peak emission intensity of said second fluorescent material, C is a peak emission intensity of said third fluorescent material, and D is a peak emission intensity of said fourth fluorescent material, which are measured using a spectrally corrected fluorescence spectrophotometer.

21. The light emitting device according to claim 1, wherein said mixed fluorescent material is a material obtained by mixing said first fluorescent material, said second fluorescent material, said third fluorescent material and said fourth fluorescent material in a mass ratio of 8:9:4:1.

22. The illumination device, which uses a light emitting device according to any one of claims 1 to 21 as a light source.

23. The light emitting device according to claim 1, wherein the semiconductor light emitting element emits a light having a wavelength in the vicinity of 450 nm.

* * * * *